(12) United States Patent
Lee et al.

(10) Patent No.: US 12,190,160 B2
(45) Date of Patent: Jan. 7, 2025

(54) NEURAL NETWORK ACCELERATOR ARCHITECTURE BASED ON CUSTOM INSTRUCTION AND DMA ON FPGA

(71) Applicant: EFINIX, INC., Cupertino, CA (US)

(72) Inventors: Yee Hui Lee, Bayan Lepas (MY); Ching Lun Yan, Bayan Lepas (MY)

(73) Assignee: EFINIX, INC., Cupertino, CA (US)

( * ) Notice: Subject to any disclaimer, the term of this patent is extended or adjusted under 35 U.S.C. 154(b) by 0 days.

(21) Appl. No.: 18/169,003

(22) Filed: Feb. 14, 2023

(65) Prior Publication Data
US 2024/0272949 A1   Aug. 15, 2024

(51) Int. Cl.
*G06F 9/50* (2006.01)
*H03K 19/177* (2020.01)

(52) U.S. Cl.
CPC ......... *G06F 9/5027* (2013.01); *H03K 19/177* (2013.01)

(58) Field of Classification Search
CPC .................................................. G06F 13/4027
See application file for complete search history.

(56) References Cited

U.S. PATENT DOCUMENTS

| | | | |
|---|---|---|---|
| 2018/0189642 A1* | 7/2018 | Boesch | G06N 3/0464 |
| 2019/0272150 A1* | 9/2019 | Lin | G06F 17/16 |
| 2020/0133854 A1* | 4/2020 | Yang | G06F 17/16 |
| 2020/0301898 A1 | 9/2020 | Samynathan et al. | |
| 2022/0198562 A1* | 6/2022 | Cella | G06Q 40/04 |
| 2023/0042226 A1* | 2/2023 | Itani | G06F 13/28 |

* cited by examiner

*Primary Examiner* — Michael J Metzger
(74) *Attorney, Agent, or Firm* — HSML P.C.

(57) ABSTRACT

The present invention relates to neural network accelerator (103) in a field programmable gate array (FPGA) which is based on custom instruction interface of an embedded processor in said FPGA and AXI master interface for DMA purposes, wherein said neural network accelerator (103) comprises of a command control block (301), at least one neural network layer accelerator (303), a response control block (305) and an AXI control block (307). The amount of neural network layer accelerators (103) that can be implemented can be configured easily (such as adding a new type of layer accelerator (303) to said neural network layer accelerator (103)) in said FPGA, which makes said invention flexible and scalable.

11 Claims, 4 Drawing Sheets

NEURAL NETWORK ACCELERATOR ARCHITECTURE BASED ON CUSTOM INSTRUCTION AND DMA ON FPGA

1. TECHNICAL FIELD OF THE INVENTION

The present invention relates to neural network accelerator in a field programmable gate array (FPGA) which is based on custom instruction interface of an embedded processor in said FPGA and AXI master interface for DMA purposes, wherein said neural network accelerator comprises of a command control block, at least one neural network layer accelerator, a response control block and an AXI control block. The amount of neural network layer accelerators that can be implemented can be configured easily (such as adding a new type of layer accelerator to said neural network layer accelerator) in said FPGA, which makes said invention flexible and scalable.

2. BACKGROUND OF THE INVENTION

Artificial intelligence (AI), especially neural network (NN) is gaining popularity and is widely used in various application domains such as vision, audio, and time series applications. Typically, AI training is performed using central processing unit (CPU) or graphics processing unit (GPU), whereas AI inference is being deployed at the edge using mobile GPU, microcontroller (MCU), application-specific integrated circuit (ASIC) chip, or field programmable gate array (FPGA).

As AI inference software stack is generally used by mobile GPU and MCU, the corresponding implementations are more flexible compared to custom implementations on ASIC chip or FPGA. Nevertheless, if the inference speed performance on a mobile GPU or MCU does not meet the requirements of a specific application, no improvement can be made to further speed-up said performance. In this case, a more powerful mobile GPU or MCU is required, which would result in higher cost and power consumption. This implies a critical restriction especially for edge AI applications, where power usage is a key concern.

On the other hand, FPGA offers a viable platform with programmable hardware acceleration for AI inference applications. However, existing FPGA-based AI solutions are mostly implemented based on custom and/or fixed AI accelerator intellectual property core (IP core), where only certain pre-defined AI layers/operations or specific network topologies and input size are supported. If certain layer types are not required by the user targeted neural network, said layer types cannot be disabled independently for resource saving. In the case if a targeted AI model comprises of a layer or operation that is not supported by the IP core, such model cannot be deployed until the IP core is updated with added support, which may involve long design cycle and causes immerse impact on time-to-market. This poses a significant drawback as AI research is fast growing, where new model topologies/layers with better accuracy and efficiency are invented at a rapid rate.

With the use of AI inference software stack running on embedded processor using FPGA, a flexible AI inference implementation with hardware acceleration is feasible. Since neural network inference is executing layer-by-layer, layer-based accelerator implementation is crucial to ensure the flexibility for supporting various neural network models.

Balavinayagam Samynathan, US 20200301898A1, disclosed a system and method for accelerating data operations by utilizing dataflow subgraph templates, but said hardware accelerator is not based on custom instructions.

Hence, it would be advantageous to alleviate the shortcomings by having a neural network accelerator architecture based on custom instruction and direct memory access (DMA) implemented on an embedded processor in an FPGA, which allows seamless integration between software stack and hardware accelerators.

3. SUMMARY OF THE INVENTION

Accordingly, it is the primary aim of the present invention to provide a neural network accelerator, which allows a seamless integration between the software stack and hardware accelerators.

It is yet another objective of the present invention to provide a high-performance neural network accelerator which utilizes memory bandwidth optimally through DMA.

Additional objects of the invention will become apparent with an understanding of the following detailed description of the invention or upon employment of the invention in actual practice.

According to the preferred embodiment of the present invention the following is provided:

A neural network accelerator in a field programmable gate array (FPGA), comprising of:
at least one neural network layer accelerator;
characterized in that
said neural network accelerator further comprises of a command control block;
said neural network accelerator further comprises of a response control block;
said neural network accelerator further comprises of an Advanced extensible Interface (AXI) control block;
said neural network accelerator is connected to at least one embedded processor in said FPGA through custom instruction interface.

4. BRIEF DESCRIPTION OF THE DRAWINGS

Other aspect of the present invention and their advantages will be discerned after studying the Detailed Description in conjunction with the accompanying drawings in which.

5. DETAILED DESCRIPTION OF THE DRAWINGS

In the following detailed description, numerous specific details are set forth in order to provide a thorough understanding of the invention. However, it will be understood by the person having ordinary skill in the art that the invention may be practised without these specific details. In other instances, well known methods, procedures and/or components have not been described in detail so as not to obscure the invention.

The invention will be more clearly understood from the following description of the embodiments thereof, given by way of example only with reference to the accompanying drawings, which are not drawn to scale.

As backbone AI inference software stack is running on the embedded processor, hardware acceleration based on custom instruction approach allows a seamless integration between the software stack and hardware accelerators. The layer accelerator architecture of the present invention makes use of custom instructions and direct memory access (DMA).

Figure 1:
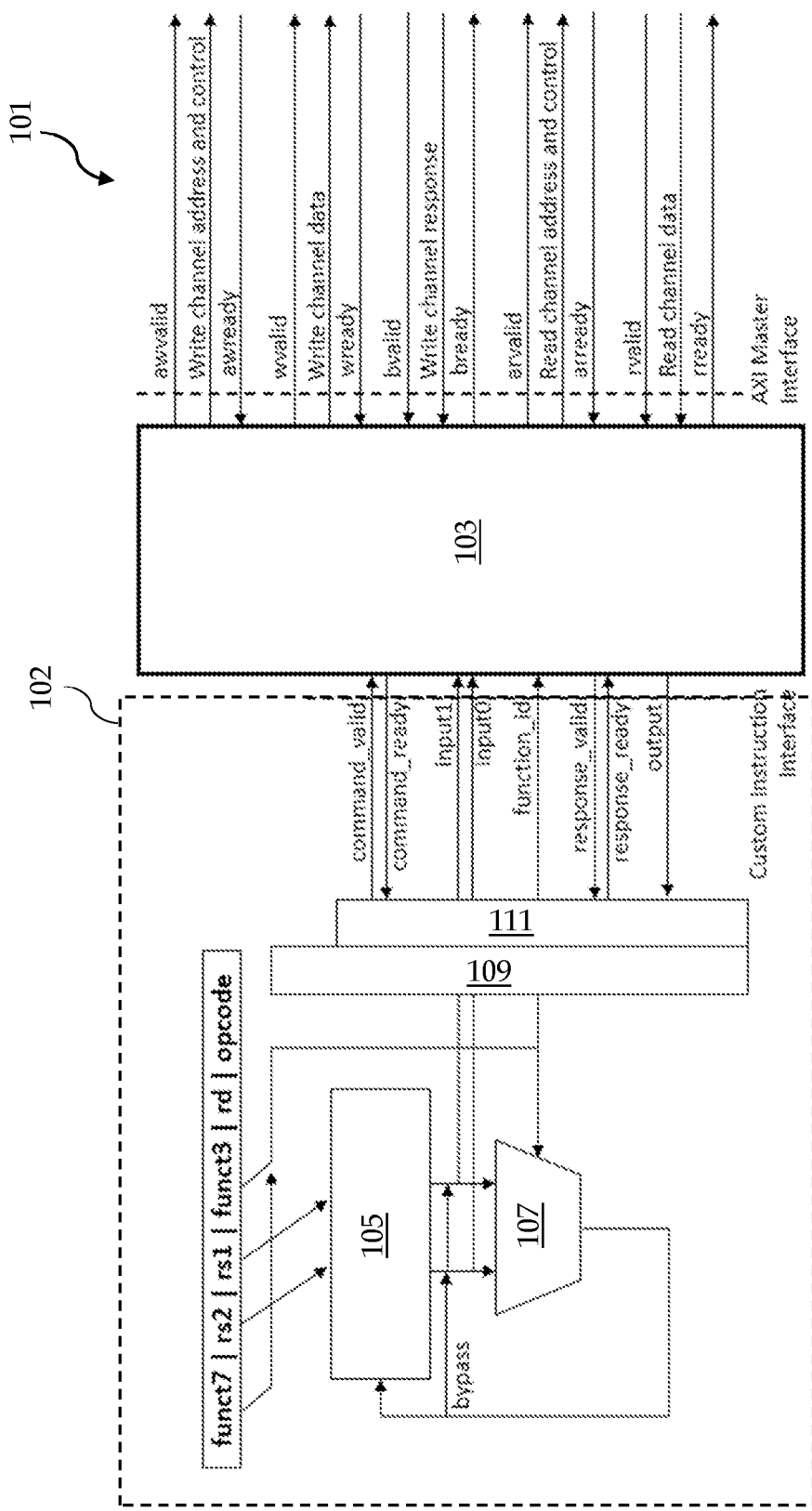
FIG. 1 is a block diagram showing an embedded processor with custom instruction interface and DMA connected to the neural network accelerator of the present invention.

In general, an instruction set architecture (ISA) defines the instructions that are supported by a processor. There are ISAs for certain processor variants that include custom instruction support, where specific instruction opcodes are reserved for custom instruction implementations. This allows developers or users to implement their own customized instruction based on targeted applications. Differing from ASIC chip where the implemented custom instruction(s) are to be fixed at development time, custom instruction implementation using an FPGA 101 is configurable/programmable by users for different applications using the same FPGA chip. FIG. 1 illustrates the block diagram of an embedded processor 102 in said FPGA 101 with custom instruction support connected to a neural network accelerator 103 through custom instruction interface, whereby said neural network accelerator 103 is with Advanced extensible Interface (AXI) master interface for connectivity with at least one DMA and implementation of said DMA.

As shown in FIG. 1, an example of custom instruction interface comprises of mainly two groups of signals: input related signals and output related signals. The input related signals are "command_valid" signal and "command_ready" signal that are used to indicate the validity of the "input0" signal, the "input1" signal, and the "function_id" signal. The output related signals are "response_valid" signal and the "response_ready" signal that are used to indicate the validity of the "output" signal. With a single/one custom instruction opcode and M-bit of "function_id" signal, a total of $2^M$ custom instructions can be implemented. FIG. 1 shows an example of an embedded processor 102 based on the VexRiscv CPU architecture with custom instructions support, whereby funct7, rs2, rs1, funct3 and rd are of the R-type RISC-V base instruction format used for custom instructions. Register file 105, arithmetic logic unit (ALU) 107, pipeline control 109, and custom instruction plugin 111 are part of this CPU architecture of the embedded processor 102. Even through RISC-V is shown as an example of the embedded processor 102 to be used in the present invention, any other suitable embedded processors 102 can be used for the purpose of the present invention. On the other hand, a AXI master interface comprises of signals for write channel address and control, write channel data, write channel response, read channel address and control, read channel data and other valid and ready signals.

Figure 2:
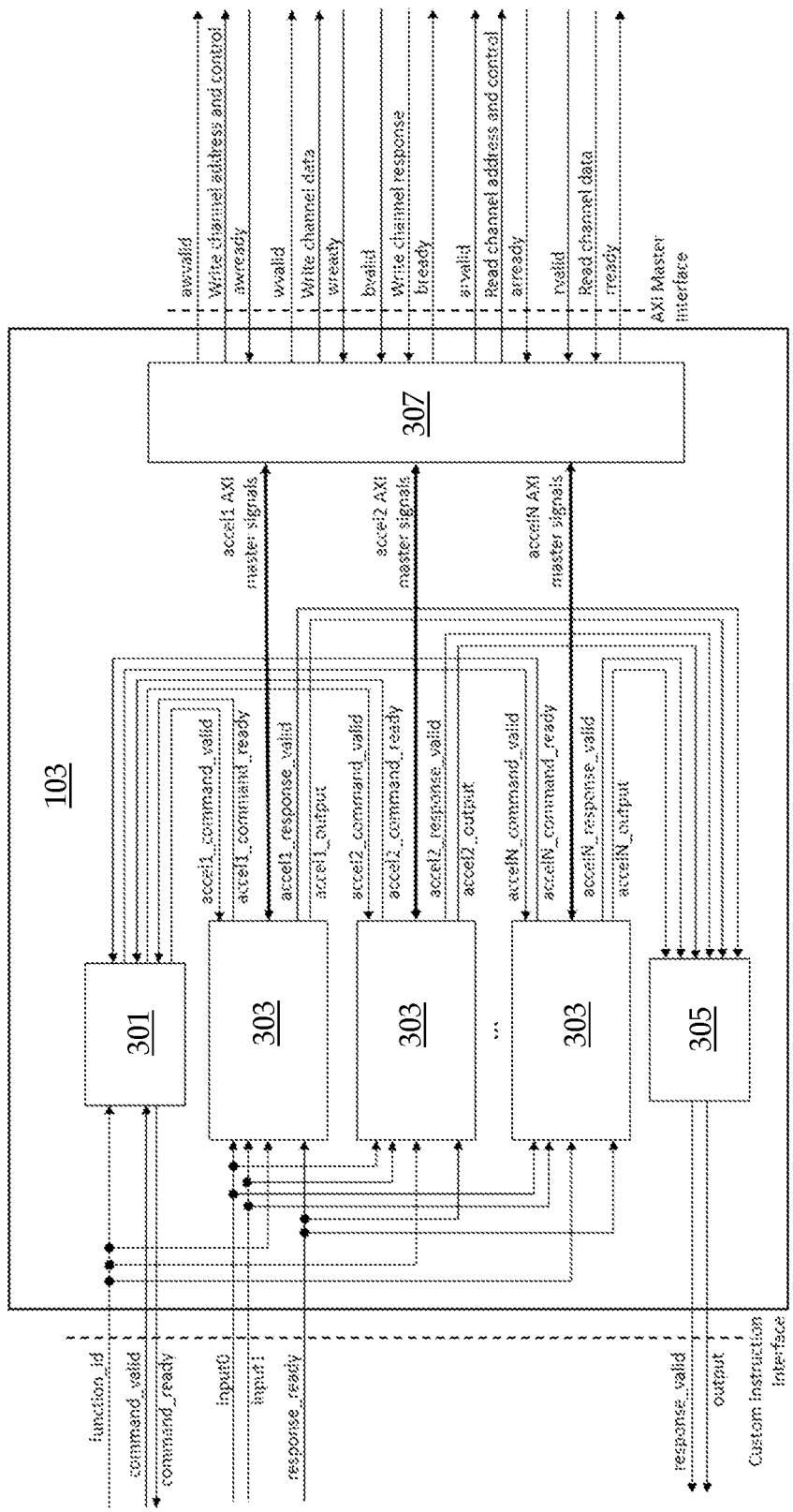
FIG. 2 is a block diagram showing the components inside said neural network accelerator of the present invention.

This invention focuses on the architecture of neural network layer accelerator, which is based on custom instruction interface and AXI master interface for DMA purposes. The proposed neural network architecture is depicted in FIG. 2. As shown in FIG. 2, the architecture of the neural network accelerator 103 in an FPGA of the present invention comprises of a command control block 301, at least one neural network layer accelerator 303, a response control block 305 and an AXI control block 307. As shown in FIG. 2, the single or one custom instruction interface and AXI master interface is shared among the layer accelerators 303 which are available in said neural network accelerator 103 for scalability, flexibility and efficient resource utilization. With the sharing of a single or one custom instruction interface and AXI master interface, the number of neural network layer accelerators that can be implemented can be configured easily in said FPGA, which is highly flexible and scalable. Users, designers or developers can enable only the specific types of layer accelerator 303 that are required for a targeted neural network application, instead of enabling all the available layer accelerators 303, thereby providing efficient resource utilization. Furthermore, more layer accelerators 303 for different neural network layers or operations can be easily added to the proposed neural network accelerator 103, due to the scalable architecture of said neural network accelerator 103.

In addition, with the AXI master interface for DMA, the neural network layer architecture of the present invention can obtain higher memory throughput (compared to using custom instruction interface for data access), thus achieving faster layer accelerator speed-up. Note that, with the neural network accelerator architecture shown in FIG. 2, it is also possible for said neural network accelerator 103 to be configured to have both the layer accelerator only based on custom instructions and layer accelerator based on custom instructions and AXI master interface; based on the needs of the applications. Depending on the needs or requirement of the application or target AI model used, if the AXI interface is not utilized, less logic resources are utilized in said neural network accelerator 103, but with less acceleration performance. If the AXI interface is utilized for data access, more logic resources are utilized in said neural network accelerator 103, but with more acceleration performance. This flexibility to trade-off between speed and resources utilization is another advantage of the present invention.

The layer accelerator 303 is implemented based on layer type e.g., convolution layer, depthwise convolution layer, and fully connected layer, which can be reused by a neural network model that comprises of a plurality of layers of the same type. Not all targeted AI models would require all the layer accelerators to be implemented. The present invention allows configuration at compile time for individual layer accelerator enablement for efficient resource utilization. Each layer accelerator has its own set of "command_valid" signal, "command_ready" signal, "response_valid" signal, "output" signals and AXI master signals.

The command control block 301 is used for sharing the "command_ready" signals from said plurality of layer accelerators 303 and "command_valid" signals to said plurality of layer accelerators 303 by using the "function_id" signal for differentiation. The command control block 301 receives said "function_id" signal from said embedded processor 102 while become intermediary for transferring of "command_valid" signal from said embedded processor 102 to said neural network layer accelerator 303 and transferring of "command_ready" signal from said neural network layer accelerator 303 to said embedded processor 102. The M-bit "function_id" signal can be partitioned to multiple function ID blocks, whereby one function ID block is allocated specifically for one layer accelerator 303. One example method of partitioning the "function_id" signal is based on the one of more most significant bit (MSB) bit(s) of the "function_id" signal, depending on how many function ID blocks are desired. For example, if the partition is based on 1-bit MSB, two blocks will be created, while if the partition is based on 2-bit MSB, four blocks will be created. In general, partitioning N-bits of MSB creates $2^N$ blocks. The command control block 301 refers to the MSB bit(s) of said "function_id" signal to identify the specific layer accelerator 303 that is associated with the specific incoming custom instruction command.

The response control block 305 becomes intermediary by means of multiplexing for transferring of the "response_valid" signal and the "output" signal from each neural network layer accelerator 303 to one "response_valid" signal and one "output" signal of the custom instruction interface to said embedded processor 102. As neural network inference typically executes the model layer-by-layer, only one layer accelerator 303 would be active at a time. In this case, straightforward multiplexing can be used in the response control block 305.

The layer accelerator 303 receives said "input0" signal, "input1" signal, said "response_ready" signal and said "function_id" signal from said embedded processor 102; receives "command_valid" signal from said embedded processor 102 through said command control block 301; transmits "command_ready" signal to said embedded processor 102 through said command control block 301; transmits "response_valid" signal and "output" signal to said embedded processor 102 through said response control block 305.

The AXI control block 307 in said neural network accelerator 103 manages the sharing of AXI master interface across said neural network layer accelerators 303 through multiplexing, AXI interconnect module or any other suitable signal management methodology. The AXI control block 307 is used for sharing of a AXI master interface across multiple layer accelerators. As neural network inference typically executes the model layer-by-layer, only one layer accelerator would be active at a time. Either AXI interconnect module or straightforward multiplexing can be applied in the AXI control block 307. In essence, an arbiter is needed to share the AXI master interface so that said neural network accelerator 103 can support multiple masters and slaves.

Figure 4:
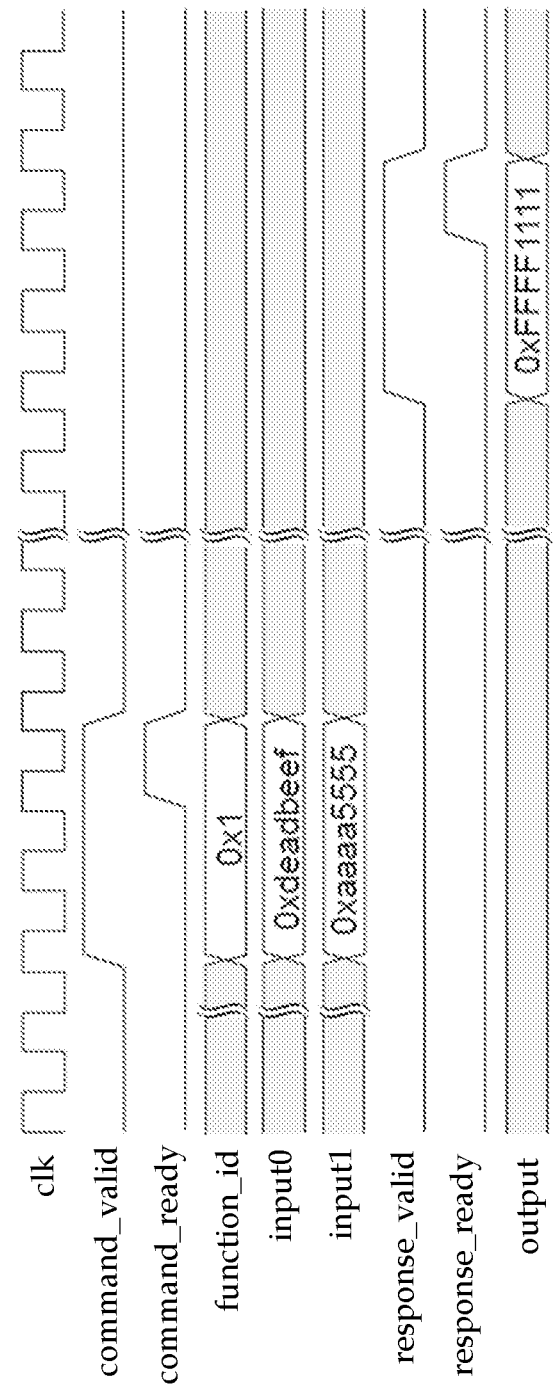
FIG. 4 is a waveform showing an example of the process of custom instruction interfaces in the VexRISC-V CPU architecture.

The proposed neural network accelerator 103 makes use of the AXI master interface for communication between said neural network accelerator 103 and said DMA in tasks such as input data retrieval, output data storage, etc.; while using the custom instruction interface for passing individual layer accelerator's 303 parameters, and related controls signals such as those for triggering the computation in the layer accelerator 303, reset certain block(s) in the neural network accelerator 103, etc. In each individual layer accelerator block, a specific set of custom instructions are created to transfer said layer accelerator's 303 parameters and control signals, by utilizing the allocated function IDs for said respective layer accelerator 303 type accordingly. Note that, for the layer accelerator architecture of the present invention, the designer may opt for implementing custom instructions to speed-up only certain compute-intensive computations in a neural network layer or implementing a complete layer operation into the layer accelerator, with consideration of design complexity and achievable speed-up. The data/signal transfer between the neural network accelerator 103 and said embedded processor 102 are controlled by said embedded processor's 102 modified firmware/software, which may be within an AI inference software stack or a standalone AI inference implementation. Note that, for the layer accelerator architecture of the present invention, it is typically more efficient to implement a complete layer operation into the layer accelerator to effectively utilize the achievable DMA throughput. FIG. 4 is a waveform showing an example of the process of the custom instruction interfaces used in the VexRISC-V CPU architecture.

Figure 3:
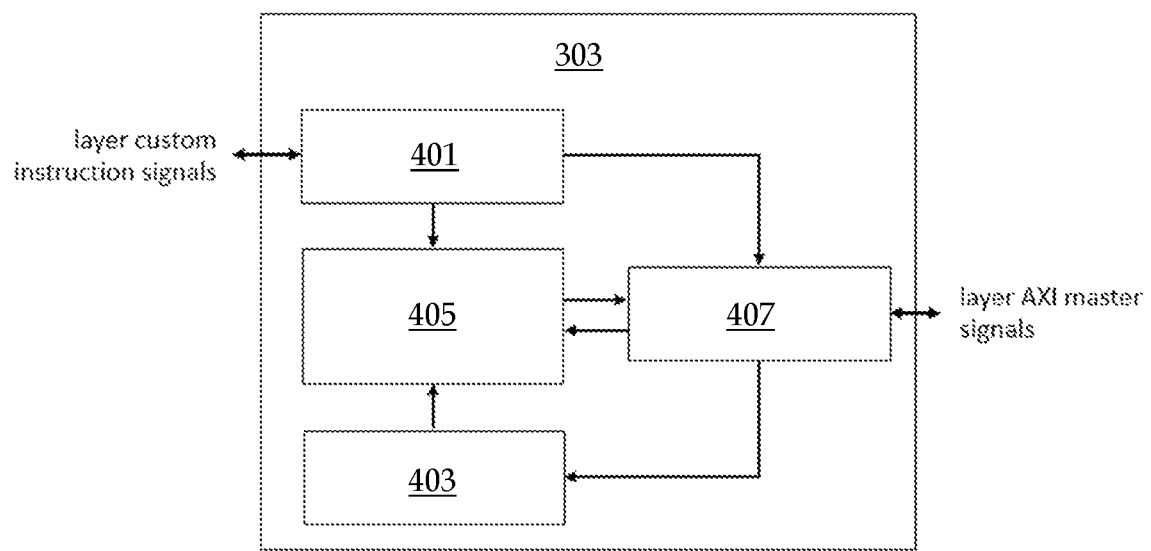
FIG. 3 is a block diagram of a general layer accelerator.

FIG. 3 illustrates the block diagram of a general layer accelerator of the present invention. As shown FIG. 3, a general layer accelerator 303 of the present invention comprises of a control unit 401, a compute unit 405, a data buffer 403 and a DMA control block 407. Note that, the layer accelerator 303 design may vary based on targeted layer type. The control unit 401 interprets at least one custom instruction input of said custom instruction interface based on the respective function ID to differentiate whether they are the layer parameters, input data to be stored in data buffer 403 for subsequent computation, input data to be used directly for computation, or control signals and so on. Layer parameter information are to be retained until the completion of a layer execution to facilitate the related control for data storage and retrieval to/from data buffer 403, computations, etc. On the other hand, the compute unit 405 performs at least one operation, computation or combination thereof, required by at least one targeted layer type of said neural network accelerator 103.

For layer accelerator 303 type that requires more than one set of inputs simultaneously for efficient parallel computations by the compute unit 405, the data buffer 403 can be used to hold the data from said custom instruction input while waiting for the arrival of the other set(s) of input data to start the computations. Also, data buffer 403 can be used to store data from said custom instruction input that is highly reused in the layer operation computations. The control unit 401 facilitates transfer of computation output from said compute unit 405 to said response control block 305.

The role of DMA control block 407 is to facilitate input and output data access for the layer accelerator 303 computations through AXI master interface. The addresses of input and output data arrays are obtained through the custom instruction, and control unit 401 generates the corresponding triggers to the DMA control block 407 based on the targeted layer operation.

While the present invention has been shown and described herein in what are considered to be the preferred embodiments thereof, illustrating the results and advantages over the prior art obtained through the present invention, the invention is not limited to those specific embodiments. Thus, the forms of the invention shown and described herein are to be taken as illustrative only and other embodiments may be selected without departing from the scope of the present invention, as set forth in the claims appended hereto.

What is claimed is:

1. A neural network accelerator in a field programmable gate array (FPGA), comprising:
    at least one neural network layer accelerator;
    a command control block;
    a response control block;
    an Advanced extensible Interface (AXI) control block;
    wherein said neural network accelerator is connected to at least one embedded processor in said FPGA through a custom instruction interface,
    wherein said at least one neural network layer accelerator comprises:
    a control unit configured to interpret at least one custom instruction input of said custom instruction interface;
    a data buffer configured to hold data from said custom instruction input, store data from said custom instruction input or a combination thereof;
    a compute unit configured to perform at least one operation, computation or a combination thereof, required by at least one targeted layer type of said neural network accelerator;
    said control unit further configured to facilitate transfer of computation output from said compute unit to said response control block; and
    a direct memory access (DMA) control block,
    wherein the response control block is configured to be an intermediary by means of multiplexing for transferring of a "response_valid" signal and an "output" signal from each of the at least one neural network layer accelerator to one "response_valid" signal and one "output" signal of the custom instruction interface to said at least one embedded processor, and wherein the neural network accelerator is configured so that users, designers or developers can enable specific types of said at least one neural network layer accelerator that are required for a targeted neural network application, instead of enabling all of a plurality of network layer accelerators that are available, thereby providing efficient resource utilization.

2. The neural network accelerator, as claimed in claim 1, wherein said custom instruction interface comprises of input related signals and output related signals.

3. The neural network accelerator, as claimed in claim 2, wherein said input related signals are "command_valid" signal and "command_ready" signal that are used to indicate the validity of "input0" signal, "input1" signal, and "function_id" signal; and said output related signals are "response_valid" signal and the "response_ready" signal that are used to indicate the validity of "output" signal.

4. The neural network accelerator, as claimed in claim 3, wherein said command control block receives said "function_id" signal from said embedded processor while become intermediary for transferring of "command_valid" signal from said embedded processor to said neural network layer accelerator and transferring of "command_ready" signal from said neural network layer accelerator to said embedded processor.

5. The neural network accelerator, as claimed in claim 3, wherein said response control block becomes intermediary for transferring of "response_valid" signal and "output" signal from said neural network layer accelerator to said embedded processor.

6. The neural network accelerator, as claimed in claim 3, wherein said layer accelerator receives said "input" signal, "input1" signal, said "response_ready" signal and said "function_id" signal from said embedded processor; receives "command_valid" signal from said embedded processor through said command control block; transmits "command_ready" signal to said embedded processor through said command control block; transmits "response_valid" signal and "output" signal to said embedded processor through said command control block.

7. The neural network accelerator, as claimed in claim 1, wherein said AXI control block manages the sharing of AXI master interface across said neural network layer accelerators.

8. The neural network accelerator, as claimed in claim 7, wherein AXI control block manages said sharing through multiplexing, AXI interconnect module or any other suitable signal management methodology.

9. The neural network accelerator, as claimed in claim 1, wherein said DMA control block facilitates input and output data access for layer accelerator computations through said AXI master interface.

10. The neural network accelerator, as claimed in claim 1, wherein the neural network accelerator comprises the plurality of neural networks layer accelerators.

11. A field programmable gate array (FPGA), comprising the neural network accelerator as claimed in claim 1, and the at least one embedded processor.

* * * * *